United States Patent [19]

Adam

[11] Patent Number: 4,493,058
[45] Date of Patent: Jan. 8, 1985

[54] INTEGRATED CIRCUIT FOR WRITING, READING AND ERASING MEMORY MATRICES WITH INSULATED-GATE FIELD-EFFECT TRANSISTORS HAVING NON-VOLATILE STORAGE BEHAVIOUR

[75] Inventor: Fritz G. Adam, Freiburg, Fed. Rep. of Germany

[73] Assignee: ITT Industries, Inc., New York, N.Y.

[21] Appl. No.: 359,536

[22] Filed: Mar. 18, 1982

[30] Foreign Application Priority Data

Apr. 1, 1981 [EP] European Pat. Off. ........ 81102460.3

[51] Int. Cl.³ ............................................ G11C 11/40
[52] U.S. Cl. .................................... 365/189; 365/182
[58] Field of Search ................ 365/189, 182, 185, 218

[56] References Cited

U.S. PATENT DOCUMENTS 4,228,527  10/1980  Gerber et al. ...................... 365/185
4,330,850   5/1982  Jacobs et al. .

Primary Examiner—Joseph A. Popek
Attorney, Agent, or Firm—Donald J. Lenkszus

[57] ABSTRACT

A memory access and control circuit is described for use with a non-volatile memory matrix utilizing insulated gate field effect transistors. Two one out of n selector circuits which are complementary in operation and which are formed from transistors of opposite conductivity type are formed on an integrated circuit and transistors of one conductivity type are formed in insulating islands in the substrate.

10 Claims, 20 Drawing Figures

Fig. 3a
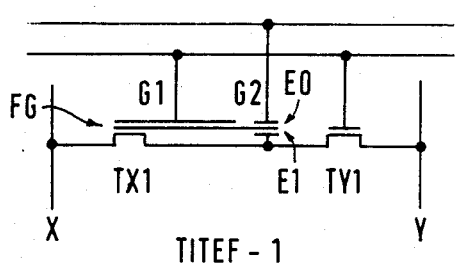
TITEF - 1
Fig. 3b
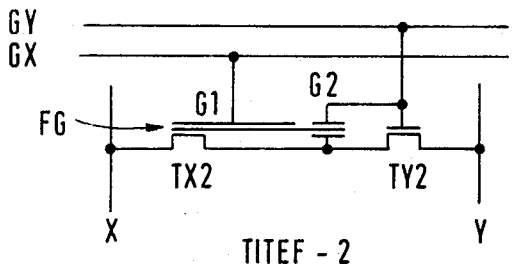
TITEF - 2
Fig. 3c
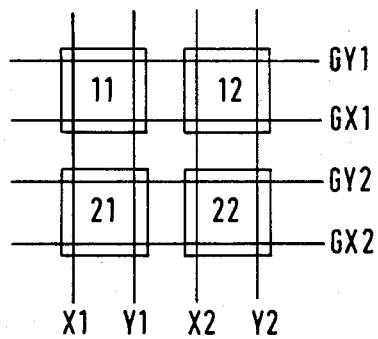
Fig. 3d
|    | 11 | 12 | 21 | 22 |
|----|----|----|----|----|
|    | GY1,GX1,X1,Y1 | GY1,GX1,X2,Y2 | GY2,GX2,X1,Y1 | GY2,GX2,X2,Y2 |
| St | 0  0  0  0 | 0  0  0  0 | 0  0  0  0 | 0  0  0  0 |
| R  | Ud Ud 0 (0/Ud) | Ud Ud 0 (0/Ud) | 0  0  0 (0/Ud) | 0  0  0 (0/Ud) |
| W0 | Up 0  0  0 | Up 0  0  0 | 0  0  0  0 | 0  0  0  0 |
| W1 | Up Up (0) 0 | Up Up (Up) Up | 0  0  (0) 0 | 0  0  (Up) Up |

Fig. 4a  Fig. 4b
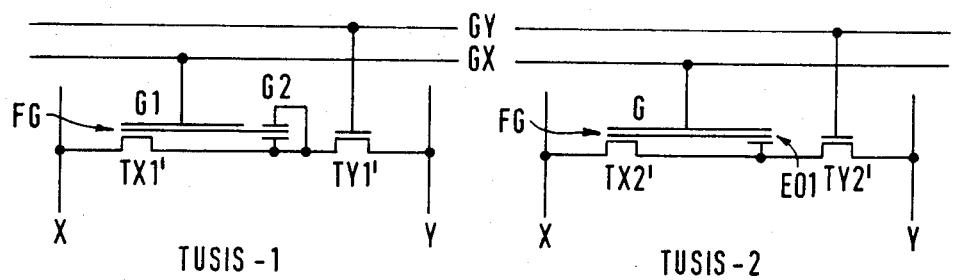
Fig. 4c
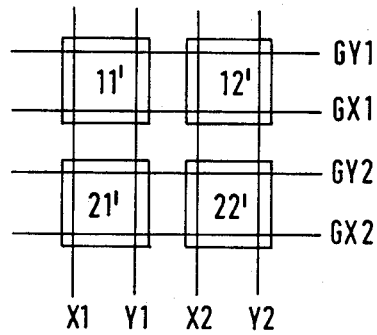
Fig. 4d
|    | 11' | | | | 12' | | | | 21' | | | | 22' | | | |
|----|-----|---|---|---|-----|---|---|---|-----|---|---|---|-----|---|---|---|
|    | GY1 | GX1 | X1 | Y1 | GY1 | GX1 | X2 | Y2 | GY2 | GY2 | X1 | Y1 | GY2 | GY2 | X2 | Y2 |
| St | 0 | 0 | 0 | 0 | 0 | 0 | 0 | 0 | 0 | 0 | 0 | 0 | 0 | 0 | 0 | 0 |
| R  | Ud | Ud | 0 | (0/Ud) | U | U | 0 | (0/Ud) | 0 | 0 | 0 | (0/Ud) | 0 | 0 | 0 | (0/Ud) |
| W0 | Up | 0 | (Up) | Up | Up | 0 | (0) | 0 | 0 | 0 | (Up) | Up | 0 | 0 | (0) | 0 |
| W1 | Up | Up | 0 | 0 | Up | Up | 0 | 0 | 0 | 0 | 0 | 0 | 0 | 0 | 0 | 0 |

Fig. 5
| AX1 | L | L | L | L | L | L | L | L | H | H | H | H | H | H | H | H |
|---|---|---|---|---|---|---|---|---|---|---|---|---|---|---|---|---|
| AX2 | L | L | L | L | H | H | H | H | L | L | L | L | H | H | H | H |
| AX3 | L | L | H | H | L | L | H | H | L | L | H | H | L | L | H | H |
| AX4 | L | H | L | H | L | H | L | H | L | H | L | H | L | H | L | H |
| | 0 | 1 | 2 | 3 | 4 | 5 | 6 | 7 | 8 | 9 | 10 | 11 | 12 | 13 | 14 | 15 |
Fig. 6
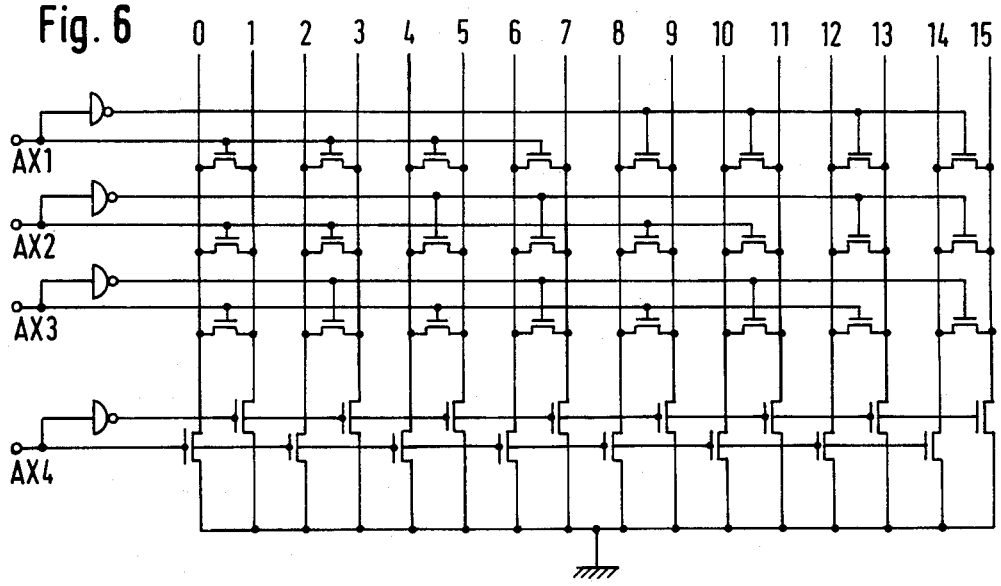
Fig. 7
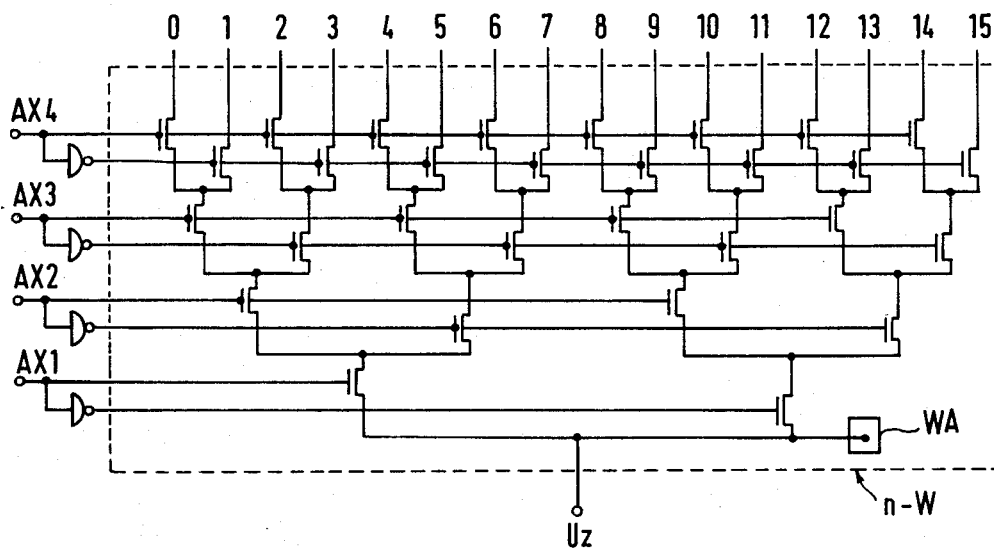

Fig. 8a
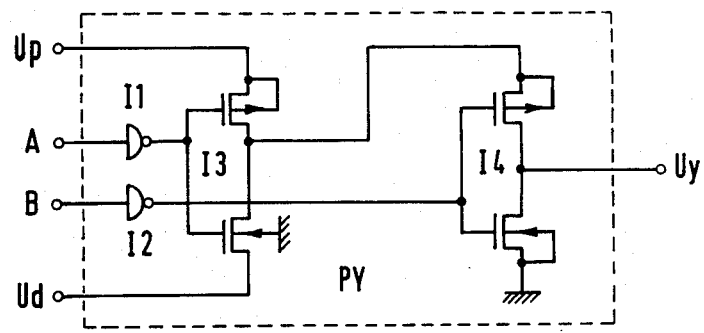
Fig. 8b
| A | B | Uy | |
|---|---|----|---|
| L | L | 0  | St |
| L | H | Ud | R |
| H | L | 0  | W0 |
| H | H | Up | W1 |
Fig. 9a
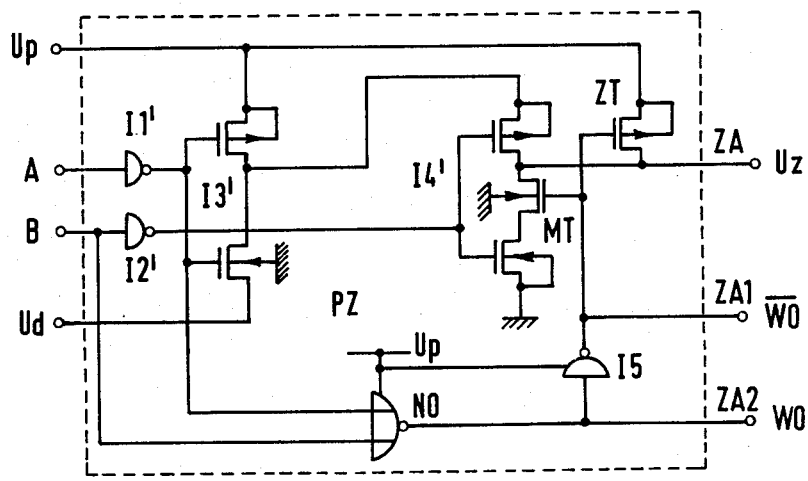
Fig. 9b
| A | B | Uz | |
|---|---|----|---|
| L | L | 0  | St |
| L | H | Ud | R |
| H | L | Up | W0 |
| H | H | Up | W1 |

INTEGRATED CIRCUIT FOR WRITING, READING AND ERASING MEMORY MATRICES WITH INSULATED-GATE FIELD-EFFECT TRANSISTORS HAVING NON-VOLATILE STORAGE BEHAVIOUR

BACKGROUND OF THE INVENTION

This invention relates to an integrated circuit for writing, reading and erasing memory matrices employing insulated-gate field-effect transistors having a non-volatile storage behavoir. Such memory matrices may consist of field-effect transistors such as MNOS transistors whose gate insulating layer is composed of two different materials, e.g., silicon dioxide and silicon nitride. Another group of such memory matrices employs so-called "floating-gate" transistors which comprise a gate electrode which has no electrical connection to the outside.

One group of "floating gate" transistors is described in "1980 IEEE International Solid-State Circuits Conference, Digest of Technical Papers", February 1980, pp. 152, 153 and 271, and "Electronics", Feb. 28, 1980, pp. 113 through 117. The characteristic feature of this kind of floating gate transistors is that they operate with a pure tunneling effect without involving hot charge carriers. For the purposes of the present specification, memory cells employing these conventional types of floating gate transistors are referred to as TUSIS memory cells, with the acronym standing for the English name Tunnel Single Injector Storage Cell.

Another variant form of floating gate transistors making use of the tunneling effect is disclosed in the earlier European Patent Application 81 10 1105.5 which is based on the German Patent Application P 30 07 892.3-53. For the purposes of the present specification, this variant form is referred to as TITEF memory cells, with the acronym standing for Tunnel-Injector Tunnel-Emitter, Floating-Gate.

To operate such memory matrices having a non-volatile storage behavior requires circuits for writing, reading and erasing, which are also referred to as peripheral circuits. The circuits previously employed for this purpose were MOS insulated-gate field-effect transistor circuits, realized in a single-channel technique, i.e., employing transistors of a single channel conductivity type. In the inoperative state of such single-channel circuits, a quiescent current always flows. Therefore, the current requirement of the total circuit including the memory matrix and the peripheral circuit increases as the memory size increases to an extent that the realization of the total circuit is not practical.

Although the aforementioned TUSIS or TITEF memory cells require only negligibly small currents for programming, this advantage is not noticeable because the previous conventional peripheral circuits have considerable current consumption.

SUMMARY OF THE INVENTION

It is an object of the invention to provide an integrated circuit for writing, reading and erasing the aforementioned memory matrices, featuring a negligibly low current consumption, especially quiescent-current consumption.

The idea underlying the invention is to carry out the addressing and programming (erasing and writing) completely in a "CMOS manner", and to perform readout in accordance with the principles underlying the CMOS technique. The basic elements of the invention include potential selection circuits, realized in accordance with the CMOS technique, for selecting the rows and columns, as well as a one-ex-N-decoder having the CMOS-inverter behavoir. The decoder is provided by an address and output-sided parallel connection of an open-circuit one-ex-N-decoder consisting of transistors of the one channel-conductivity type and of a short-circuit one-ex-N-decoder consisting of transistors of the other channel-conductivity type, which is arranged in a separate insulating island of the one channel-conductivity type. Since in the open circuit decoder only the addressed current branch is rendered non-conductive while all other branches are conductive, and since in the short-circuit decoder, however, only the addressed current branch is rendered conductive while all other branches are non-conductive, the behavior of CMOS-inverters will result from the address and output-sided parallel connection with respect to the two addressed as well as to all non-addressed current branches.

One advantage of the invention is it is possible to integrate memory matrices having a non-volatile storage behavior, including their peripheral circuits, in one single semiconductor crystal, having low current consumption so as to permit long standby operation.

BRIEF DESCRIPTION OF THE DRAWINGS

The invention will be better understood from a reading of the following detailed description in conjunction with the drawings, in which:

FIGS. 3a to 3d show two variant forms of TITEF memory cells, as well as a potential-allocation table;

FIGS. 4a to 4d show two variant forms of TUSIS memory cells, as well as a corresponding potential allocation table;

FIG. 5 shows the binary numbers allocated to the decimal numbers 0 to 15;

FIG. 6 is a circuit diagram of an open-circuit decoder capable of being employed within the scope of the invention;

FIG. 7 is a circuit diagram of a short-circuit decoder;

FIGS. 8a and 8b are circuit diagrams of a column potential selection circuit;

FIGS. 9a and 9b are circuit diagrams of a row-potential selection circuit;

DETAILED DESCRIPTION

Figure 1:
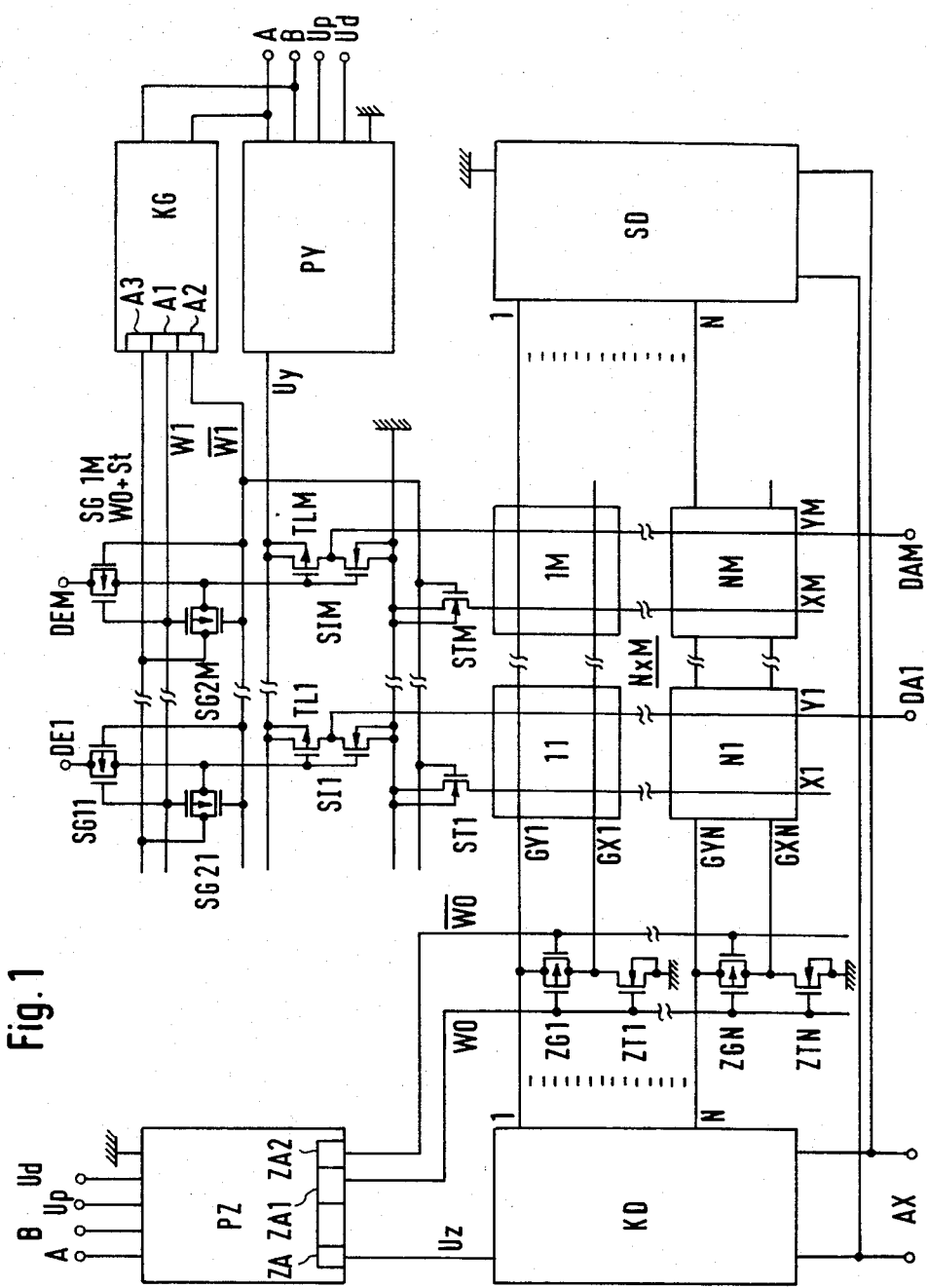
FIG. 1 is the schematic circuit diagram of a first type of embodiment of the invention relating to TITEF memory cells.

The schematic circuit diagram relating to an example of a memory matrix N×M which includes four TITEF memory cells 11, 1M, N1, NM. Two possible variant forms of such TITEF memory cells are shown in FIGS. 3a and 3b where they are indicated by TITEF-1 or TITEF-2 respectively. The individual memory cell consists of a storage transistor TX1 or TX2 and of a select transistor TY1 of TY2 connected with its switching section in series with the switching section of the storage transistors TX1 or TX2, respectively. Both the storage and the select transistor are of the same channel conductivity type. In all of the drawings it is assumed that the channel conductivity is the n-type. The series connection of the switching sections of the storage and the select transistor is arranged between the storage-transistor sided first column line X (X1, X2 in FIG. 3c or X1 and XM in FIG. 1) and the second column line Y (Y1, Y2 in FIG. 3c of Y1, YM in FIG. 1).

The storage transistor TX1, TX2 includes the two external gates G1, G2. The first gate G1 has a larger surface than the second gate G2, and is connected to the first row line GX or GX1, GX2 or GX1, GXN, respectively.

In the TITEF memory cells according to FIGS. 3a and 3b, the second gate G2 serves as the external tunnel electrode for writing a zero (L) which is used for the erasing operation. To the external tunnel electrode there is allocated the likewise small-surface internal tunnel electrode for the writing, which is connected to the point connecting the storage and the select transistor. Erasing is effected by the tunnel emission of electrons from the floating gate FG via the section EO, thus reducing the effective threshold voltage of the storage transistor when looked at from the first row line GX. Writing is effected by a tunnel injection into the floating gate FG via the section E1, thus increasing the effective threshold voltage.

With the TITEF-1 memory cell according to FIG. 3a, the gate of the select transistor TY1 is connected to the first row line GX whereas, for the TITEF-2 memory cell according to FIG. 3b it is connected to the second row line GY.

With respect to the simple memory matrix as shown in FIG. 3c comprising memory cell 11, 12, 21, 22, arranged as two rows and two columns. The table of FIG. 3d lists the potentials at the first and the second row lines and at the first and the second column lines, i.e., in dependence upon the operating modes St; stand-by, R: reading of the memory cells 11, 12; WO: erasing the memory cells 11, 12; W1: writing of the memory cell 11. The potentials not shown in parentheses in this tabulated programming scheme of FIG. 3d are applied to the corresponding lines from the outside. The potentials as shown in parentheses appear as follows:

(a) during the reading (R) in accordance with the programmed threshold voltage of the storage transistor TX: after erasing (WO) to O and after the writing (W1) to Ud, with O in this case being the low output potential of a ratio inverter; and (b) during the writing (W1) in accordance with the potentials of the second column lines of the written row, while the first column lines are separated from the zero point of the circuit during the writing.

In FIG. 1 the short-circuit decoder KD and the open-circuit decoder SD are arranged on opposite sides of the memory matrix N×M. The address inputs AX of both decoders are respectively connected to one another, i.e., the same row address is applied to both decoders. The row outputs 1 to N are connected to one another via the second row lines GY1, GYN which may also be referred to as word lines.

Each memory row 1 . . . N is provided with a row transmission gate ZG1, ZGN. The switching section of each transmission gate ZG1, ZGN is connected between the first and the second row line GX1, GY1; GXN, GYN of each memory row. A row transistor ZT1, ZTN is likewise provided per memory row and connects the respective first row line GX1, GXN to the zero point of the circuit. Each row transistor is of the one channel conductivity type, i.e., an n-channel transistor. Thus, the respective row transistor ZT1, ZTN and the complementary partial transistor of the row transmission gates ZG1, ZGN form a CMOS inverter which is arranged between the zero point of the circuit and the second row line GY1, GYN. In FIG. 1 the partial transistor of the row transmission gate is the one shown on the left. The gates of these two CMOS inverter transistors are connected to one another and are selected by the first additional potential output ZA1 of row potential selection circuit PZ by the signal WO. The other transistor of the row transmission gate is selected by the second additional potential output ZA2 of the row potential selection circuit by a signal $\overline{WO}$ which is complementary to the signal WO.

Each first column line X1, XM is connected via the switching section of the respective column transistor ST1, STM of the one channel conductivity type, i.e., an n-channel transistor to the zero point of the circuit. Every second column line Y1, YM belongs to the corresponding data output DA1, DAM and is connected to the output of the respective column inverters SI1, SIM. The switching section thereof is coupled on one end to the zero point of the circuit and, on the other end, to the potential output Uy of the column potential selection circuit PY.

Each data input DE1, DEM is associated with one column and is connected via the switching section of a respective first column transmission gate SG11, SG1M, to the input of the corresponding column inverter SI1, SIM. Moreover, via the switching section of the respective second column transmission gate SG21, SG2M, the input of the respective column inverter SI1, SIM is connected to the third output A3 of the complex gate KG and is selected by the signal WO+St.

The gates of the n-channel transistors of the first column transmission gates SG11, SG1M and the gates of the p-channel transistors of the second column transmission gates SG21, SG2M are coupled to the first complex gate output A1 and are selected by the signal W1. The gates of the p-channel transistors of the first column transmission gates SG11, SG1M and the gates of the n channel transistors of the second column transmission gates SG21, SG2M are connected to the second complex gate output A2 and are selected by the signal $\overline{W1}$ which is complementary to the signal W1.

Transistor TL1, TLM of the respective column inverter SI1, SIM is coupled to the potential Uy. During reading of the memory cells, transistor TL1, TLM is arranged in series with the storage transistor and the column transistor ST1, STM to form a ratio inverter, with the transistor TL1, TLM being the load resistor thereof.

FIGS. 6 and 7 respectively show in detail the one-out-of-sixteen open-circuit decoder SD and the short-circuit decoder KD utilized in FIG. 1. Decoders SD and KD utilize conventional circuits the design of which will be easily understood by the person skilled in the art, from the two drawings, so that a detailed explanation may be omitted herein. As can be seen from the Table shown in FIG. 5, these two decoders have outputs 0–15 which are selected by a four digit parallel binary signal AX1 . . . AX4. The Table of FIG. 5 shows for each of the outputs 0 . . . 15 the corresponding address AX1 . . . AX4 in a binary code.

The open-circuit decoder SD utilizes transistors of the one channel-conduction type, i.e., n-channel transistors for the circuit of FIG. 1. These transistors are arranged in the semiconductor body of the integrated circuit and connected to the zero point of the circuit.

The short-circuit decoder KD utilizes transistors of the other channel-conduction type, i.e., p-channel transistors arranged within a separate insulating island n-W of the semiconductor body of the integrated circuit which is thus n-conductive. The potential input of the short-circuit decoder KD is applied to the potential output ZA of the row potential selection circuit PZ and, moreover, is connected to the insulating island n-W via the contact WA thereof as shown in FIG. 7.

FIG. 8a illustrates a preferred column potential selection circuit PY. It includes input-sided first or second inverters I1, I2 and respective subsequently arranged third or fourth inverter I3, I4. Relative thereto, the switching section of the third inverter is connected between the input for the operating voltage Ud and the input of the programming voltage Up. The substrate of the transistor having its source connected to the operating voltage Ud is applied to the zero point of the circuit. The substrate of the transistor having its source connected to the programming voltage Up is arranged in an insulating island and is connected to the source thereof. The switching section of the fourth inverter I4 is arranged between the zero point of the circuit and the output of the third inverter I3. The substrate of the switching section transistor is connected thereto on the source side, and is arranged in an insulating island of its own, which is also applied to the output of inverter I3. The substrate of the other transistor of the fourth inverter I4 is connected to the zero point of the circuit. To the input of the first inverter I1 there is fed the first bit A. To the input of the second inverter I2 there is fed the second bit B of a two-bit signal AB. The Table in FIG. 8b, shows the output potential Uy for the four modes of operation St: stand-by; R: read; WO: write a zero and W1; write a one.

FIG. 9a shows in detail the row potential selection circuit of FIG. 1. It includes input first and second inverters I1', I2'. A third inverter I3' is arranged subsequent to the first inverter I1', with the switching section thereof lying between the operating voltage Ud and the programming voltage Up. The substrate of the transistor of invert I3' having its source connected to the operating voltage Ud is applied to the zero point of the circuit. The substrate of the other transistor of inverter I3' which is realized as an insulating island is applied to the programming voltage Up and is connected to the source terminal thereof. The output of the second inverter I2' is connected to the input of a fourth inverter I4'. Inverter I4' is modified over inverter ±4 of FIG. 8a by the addition of the intermediate transistor MT. The substrate of transistor MT is connected to the zero point of the circuit. The substrate of the transistor having its source connected to the output of the third inverter I3' is realized by a separate insulating island and is connected to the source of transistor MT. The point connecting the switching section of the intermediate transistor MT and the transistor connected to the output of the third inverter I3', is the potential output ZA of the row potential selection circuit PZ and via the switching section of the additional transistor ZT, is connected to the programming voltage Up.

The programming voltage Up series as the supply voltage for NOR gate NO and inverter I5. The first input of the NOR gate NO is coupled to the output of inverter I1' which inverts the signal A. The input of the second inverter I2' and the second input of the NOR gate No receive the second bit B. The output of the NOR gate NO is the second additional potential output ZA2 which, via inverter I5 feeds the first additionl potential output ZA. The output of inverter I5 is connected to the gates of both the intermediate and the additional transistors MT, ZT.

The Table of FIG. 9b shows the allocation of the voltages Uz at the potential output ZA relating to four conditions of the binary signal AB with the states St, R, WO, W1, having the same meaning as those shown in the Table of FIG. 8b.

The potential selection circuits according to FIGS. 8a and 9a represent certain preferred examples of embodiment of a general class of potential selection circuits, as disclosed in the simultaneously filed European Patent Application entitled "Integrated CMOS Selection Circuit for Four Potentials and their Simplifications for Three Potentials" (Case F. G. Adam—46EP 81 10 2461.1).

Figure 10:
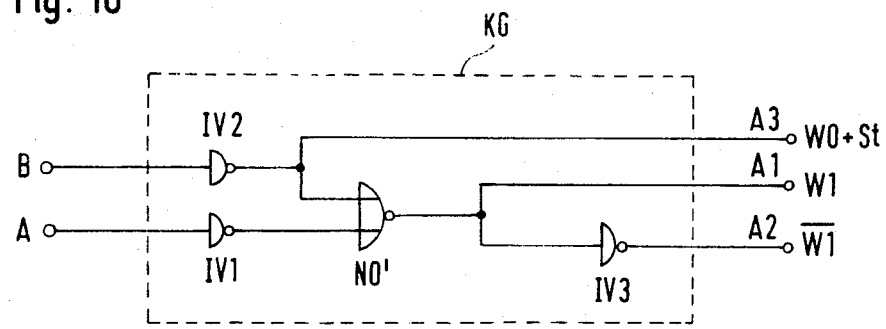
FIG. 10 is a complex gate to be employed with TITEF memory matrices.

FIG. 10 illustrates the complex gate KG according to FIG. 1. It includes input inverters IV1, IV2 the outputs of which, via the NOR gate NO', lead to the first complex gate output A1 which produces the signal W1. Inverter IV3, forms the complementary signal $\overline{W1}$ at output A2. The output of the inverter IV2 provides complex gate output A3 for the signal WO+St. The input of inverter IV1 receives first bit A, and the input of inverter IV2 receives the second bit B of the binary signal AB.

Turning back to FIG. 1, the signals WO and $\overline{WO}$ as supplied by the row potential selection circuit PZ serve to interrupt the connection existing between the first and the second row lines GX ... GY2 ... via the row transmission gates ZG ..., and to apply the first row lines GX ... to the potential of the zero point of the circuit.

The complex gate KG in FIG. 1, serves the function of connecting the input data, during the writing with the aid of the signal W1, to the gates of the transistors TL1, TLM. During reading (R), complex gate KG connects these gates in common to the potential of the zero point of the circuit, thus connecting through the output potential Uy of the column potential selection circuit PY which, in this particular case, is identical to the operating voltage Ud, to all of the first column lines Y ... which, in all other operating states, are connected through to the potential of the zero point of the circuit.

Figure 2:
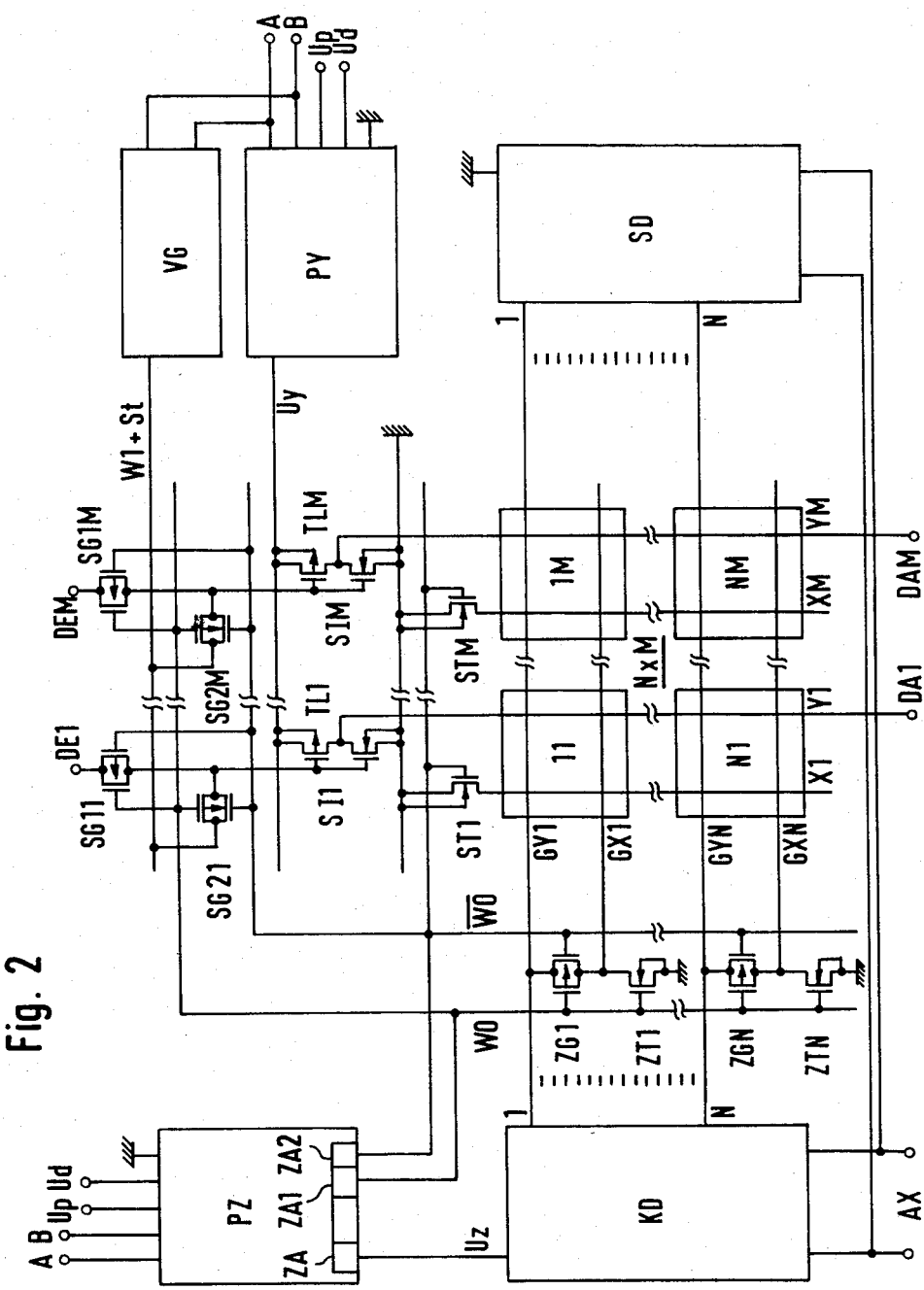
FIG. 2 is a circuit diagram of an embodiment of the invention relating to the TUSIS memory cells.

FIG. 2 extensively corresponds to the embodiment of FIG. 1, but utilizes TUSIS memory cells, of which two possible variant forms are shown in FIGS. 4a and 4b where they are referred to as TUSIS-1 or TUSIS-2 respectively. The individual memory cell therein consists of the storage transistor TX1' or TX2' and of the select transistor TY1' or TY2' which, with its switching section, is connected in series with the switching section thereof. Both the storage and the select transistor are of the same channel conductivity type; in FIGS. 2 and 4 this is the n-type. The series arrangement of the switching sections of both the storage and the select transistor is again arranged between the storage-transistor-sided first column line X or X1, X2 or X1, XM and the second column lines Y or Y1, Y2 or Y1, YM respectively.

The storage transistor Tx' again comprises the two gates G1, G2 of which the first one is applied to the first row line GX or GX1, GX2, or GX1, GXN. The second gate 2 serves as the external tunnel electrode for the writing of a zero which here, however, unlike in the TITEF memory cells of FIG. 3, is used for the data write-in. The external tunnel electrode like the small-surface internal tunnel electrode is connected to the point connecting both the storage and the select transistor. The latter is used for the writing of a One for the erase operation.

In FIG. 4a, the TUSIS-1 storage transistor for the two tunnel sections only has one external terminal, because the second gate G2 is connected to the point connecting the storage and the select transistor. This is referred to by the term "single injector". The first gate G1 of the storage transistor TX1' is connected to the first row line GX, and the gate of the select transistor TY1' is connected to the second row line GY.

With the TUSIS-2 memory cell according to FIG. 4a there is only one single injection section EO1, because the first and the second gate are combined to form the common gate G. This gate is connected to the first row line GX, and the gate of the select transistor TY2' is connected to the second row line GY. The single injection section EO1 is passed through by the tunneling electrons from above towards below in the case of the signal WO and from below towards above in the case of the signal W1. The higher tunnel current threshold voltage which has to be overcome during the tunneling from above towards below, according to the publication in "Electronics", may be kept at a sufficiently low level by using e.g., an extremely thin silicon dioxide grown on the monocrystalline substrate. For the TUSIS-1 memory cell according to FIG. 3a, this technological measure is not required. In fact, for the writing of the zero (L) as well as for the writing of the One (H), two tunneling sections EO or E1 are realized by the polysilicon dioxide which can be more easily tunneled, with both of these sections being tunneled from below towards above in the same way as in the case of the TITEF memory cells according to FIG. 3.

For the TUSIS memory cells according to FIG. 4a and FIG. 4b the programming scheme as shown in FIG. 4c applies. In this scheme, however the state WO refers to the write-in of the memory cell 11' and the state W1 refers to the erasing of the memory cells 11', 12'. Accordingly, compared with the programming scheme of FIG. 3d, and with respect to the states WO, W1, the two functions are exactly reversed. Therefore, in the case of the TUSIS memory cells, the erase operation is performed by the signal W1 in a word-by-word manner with a high threshold voltage, and with the signal WO there is written bit by bit with a lower threshold voltage.

In FIG. 2, identical parts are indicated by the same reference numerals as in FIG. 1. It is evident that instead of the complex gate KG of FIG. 1, there is provided a multiple gate VG which produces the signal W1+St to which the second column transmission gates SG21, SG2M are connected. The gates of these second column transmission gates are selected from the first or the second additional potential output A1, A2 of the row potential selection circuit PZ, with the aid of the signals WO, $\overline{WO}$.

Figure 11:
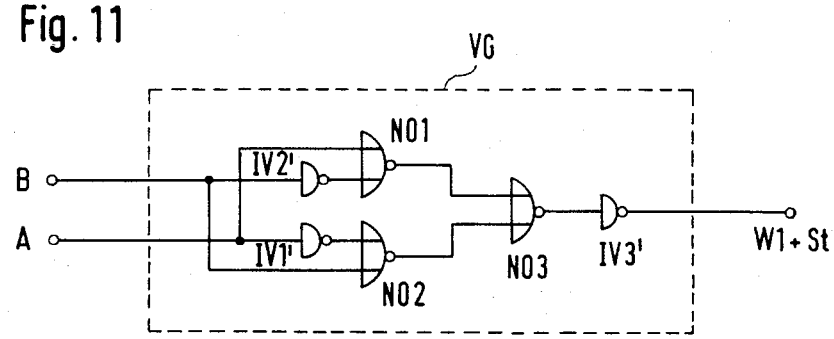
FIG. 11 is a multiple gate to be employed with TUSIS transistors.

FIG. 11 shows multiple gate VG. It includes inverters IV1', IV2' supplied with the first bit A or the second bit B respectively. The output of each inverter IV1' or IV2' together with the input of the respective other inverter IV2' or IV1' is connected via NOR gates NO1, NO2, to the two inputs of NOR gate NO3 whose output is applied to the multiple gate output via the inverter IV3'. The signal W1+St will appear at this output.

Figure 12:
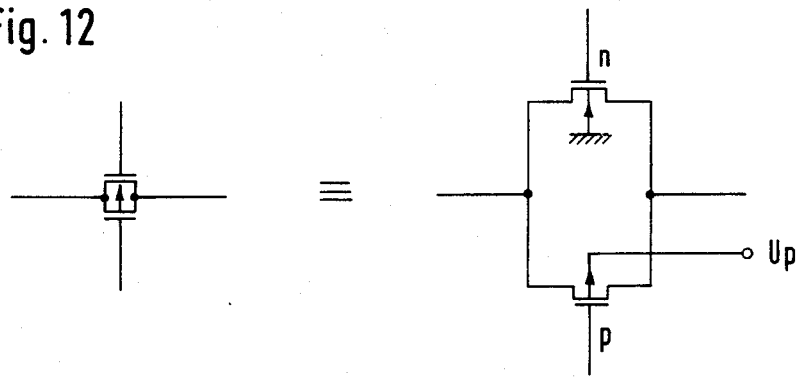
FIG. 12 is a detailed circuit diagram relating to the CMOS transmission gates to be employed with the invention.

FIG. 12 shows the detailed circuit diagram of the transmission gates when n-channel memory cells are used. In that case, the substrate of the p-channel transistor is to be designed as an insulating island to be connected to the programming voltage Up.

Another advantage of the circuit arrangement according to the invention resides in that it requires no individual insulating islands associated with the rows or the columns.

I claim:

1. A memory arrangement comprising:
a memory matrix comprising a plurality of memory cells each connected to one of a first plurality of row selection lines and to one of a first plurality of column selection lines, each cell comprising insulated gate field effect transistors having a nonvolatile storage behavior; and
an integrated circuit formed in a semiconductor body for programming said memory matrix, said circuit comprising:
a first decoder having a first plurality of address inputs and a first plurality of outputs, each of said first plurality of outputs being coupled to a corresponding one of said first plurality of row selection lines, said first decoder being responsive to address signals at said first plurality of address inputs for establishing conductive paths from all of said first plurality of outputs to a first potential input except for a selected one of said first plurality of outputs and for causing the path from said selected one of said first plurality of outputs to said first potential input to be nonconductive, said first decoder comprising insulated gate field effect transistors of a first conductivity type arranged in said semiconductor body, said first potential input and said semiconductor body being coupled to a first potential;
a second decoder having a second plurality of address inputs and a second plurality of outputs, each of said second plurality of outputs being coupled to one of said first plurality of outputs by the corresponding one of said row selection lines, each of said second plurality of address inputs being coupled to a corresponding one of said first address inputs, said second decoder being responsive to said address signals for establishing a conductive path from a selected one of said second plurality of outputs to a second potential input and for causing the paths from the remaining ones of said second plurality of outputs to said second potential input to be nonconductive, said second decoder comprising insulated gate field effect transistors of a second conductivity type arranged within an insulating island of said first conductivity type in said substrate, said second potential input being coupled to said insulating island; and
a row potential selection circuit having a potential output coupled to said second potential input.

2. An arrangement in accordance with claim 1, wherein:
said memory matrix comprises a second plurality of row lines each coupled to one row of said plurality of memory cells, a first plurality of column lines, and a second plurality of column lines, each of said first plurality of column lines coupled to one column of said plurality of memory cells, each of said second plurality of column lines coupled to one column of said plurality of memory cells, each of said second plurality of column lines coupled to one column of said plurality of memory cells;

each of said memory cells comprise a first storage transistor of said first conductivity type and an insulated gate field effect select transistor of said first conductivity type, said first storage transistor and said select transistor having their switching sections connected in series, said storage transistor having its switching section coupled to one of said first plurality of column lines, said select transistor having its switching section coupled to one of said second plurality of column lines, said first storage transistor having first and second gates, said first gate having a larger surface area than said second gate, said first gate being coupled to one of said second plurality of row lines, said second gate serving during an erase or writing operation as an external tunnel electrode having associated therewith an internal tunnel electrode connected to the node between said serially connected first storage and select transistors for effecting an erasing or writing operation;

said row potential selection circuit being responsive to selection signals for providing writing, reading or erasing voltages at said potential output, and having first and second additional potential outputs for providing first and second complementary signals;

said arrangement further comprises:

a plurality of row transistors each of said first conductivity type;

a plurality of transmission gates each connected between a corresponding pair of one of said first and one of said second plurality of row lines, each of said transmission gates comprising first and second complementary partial transistors, the switching section of each of said row transistors coupling a corresponding one of said transmission gates to said zero point, the gates of all of said row transistors and all of said first partial transistors being coupled to said first additional potential output, the gates of all of said second partial transistors being coupled to said second additional potential output.

3. A memory arrangement in accordance with claim 2, wherein:

each of said plurality of memory cells is a TITEF memory cell, each said storage transistor second gate being coupled to one of said second row lines, and further comprising:

complex logic gate means responsive to said selection signals for generating first, second and third control outputs such that $A1 = A \cdot B$, $A2 = \overline{A} \cdot B$ and $A3 = \overline{B}$ where A1, A2 and A3 are the first, second and third control outputs, respectively, and A and B are a first and a second one of said selection signals, respectively;

a first plurality of column transistors of said first conductivity type, each of said column transistors having its switching section coupled to a corresponding one of said first column lines and to said zero point, and having its gate coupled to said complex logic gate second output;

a column potential circuit;

a plurality of column inverters, each of said column inverters having its output coupled to one of said second plurality of column lines and having its switching section coupled between said zero point and said column potential circuit;

said second plurality of column lines being coupled to a plurality of memory data output terminals;

a plurality of memory data input terminals;

a plurality of first column transmission gates each having its switching section coupling one of said plurality of memory data input terminals to the input of one of said plurality of column inverters, a plurality of second column transmission gates each having a switching section coupling the input of one of said plurality of column inverters to said complex gate third output;

each of said first and second column transmission gates comprising a transistor of said first conductivity type and a transistor of said second conductivity type;

the gates of all of said first column transmission gate transistors of said first conductivity type and said second column transmission gate transistors of said second conductivity type coupled to said complex gate first output;

the gates of all of said first column transmission gate transistors of said second conductivity type and said second conductivity type and said second column transmission gate transistors of said first conductivity type being coupled to said complex gate second output.

4. A memory arrangement in accordance with claim 3, wherein:

said column potential selection circuit comprises:

first and second inverters for respectively receiving first and second ones of said selection signals;

a third inverter comprising first and second transistors of opposite conductivity types and having their switching sections serially connected between said programming voltage and an operating voltage, said first transistor being connected to said operating voltage and having its substrate connected to said zero point, said second transistor having its substrate formed as an insulating island coupled to said programming voltage, an output between said switching sections and said first inverter output coupled to the gates of said first and second transistors;

a fourth inverter comprising third and fourth transistors of opposite conductivity type and having their switching sections serially connected between said third inverter output and said zero point, then gates connected to said second inverter output, said potential selection circuit output being coupled to the junction of said serially connected switching sections, said third transistor having its substrate formed as an insulating island coupled to said third inverter output, said fourth transistor having its substrate coupled to said zero point.

5. A memory arrangement in accordance with claim 3, wherein said row potential selection circuit comprises input-sided first and second inverter receiving at the inputs first and second ones of said selection signals;

a third inverter having an input coupled to said first inverter output and having a switching section coupled between said operating voltage and said programming voltage, and having first and second transistors with the substrate of the transistor having its sosurce connected to said operating voltage coupled to said zero point and the other transistor having its substrate formed as an insulating island, connected to the source terminal thereof and to said programming voltage, the output of said second inverter being connected to the input of a fourth inverter, said fourth inverter having third and fourth transistors, said fourth transistors having its source and substrate sides to the zero point of the circuit, said third transistor having its source and substrate connected to the output of said third inverter respectively, a fifth transistor serially connected between said third and fourth transistors and having its substrate connected to said zero point, with the substrate, said third transistor connected to the output of said thid inverter and formed by a separate insulating island;

the point connecting the switching sections of said fifth transistor and said third potential output of said row potential selection circuit and is connected to said programming voltage via the switching section of an additional transistor;

a NOR gate operated by said programming voltage as the supply voltage forming a first input connected to the output of said first inverter and a second input connected to the input of said second inverter;

output of said NOR gate being said first additional potential output and a fifth inverter connected to the programming voltage as the supply voltage coupled to said NOR gate output to provide said second additional potential output; and the gates of said fifth transistor and said additional transistor are connected to said second additional potential output.

6. A memory arrangement in accordance with claim 2, wherein each of said plurality of memory cells is a TITEF memory cell, each said storage transistor second gate and the gate of a corresponding one of said select transistors being coupled to said second row line;

complex logic gate means responsive to said selector signals for generating first, second and third control outputs such that $A1 = A \cdot B$, $A2 = \overline{A \cdot B}$ and $A3 = \overline{B}$ where A1, A2 and A3 are the first, second and third control outputs, respectively, and A and B are a first and a second one of said selection signals, respectively;

a first plurality of column transistors of said first conductivity type, each of said column transistors having its switching section coupled to a corresponding one of said first column lines and to said zero point, and having its gate coupled to said complex logic gate second output;

a column potential circuit;

a plurality of column inverters, each of said column inverters having its output coupled to one of said second plurality of column lines and having its switching section coupled between said zero point and said column potential circuit;

said second plurality of column lines being coupled to a plurality of memory data output terminals;

a plurality of memory data input terminals;

a plurality of first column transmission gates each having its switching section coupling one of said plurality of memory data input terminals to the input of one of said plurality of column inverters, a plurality of second column transmission gates each having a switching section coupling the input of one of said plurality of column inverters to said complex gate third output;

each of said first and second column transmission gates comprising a transistor of said first conductivity type and a transistor of said second conductivity type;

the gates of all of said first column transmission gate transistors of said first conductivity type and said second column transmission gate transistors of said second conductivity type coupled to said complex gate first output;

the gates of all of said first column transmission gate transistors of said second conductivity type and said second conductivity type and said second column transmission gate transistors of said first conductivity type being coupled to said complex gate second output.

7. A memory arrangement in accordance with claim 2, wherein:

each of said memory cells is a TUSIS memory cell, each said storage transistor second gate being coupled to one of said second row lines;

and further comprising:

logic means having an output providing the exclusive OR of said selection signals;

a first plurality of column transistors of said first conductivity type, each having its switching section;

a first plurality of column transistors of said first conductivity type, each of said column transistors having its switching section coupled to a corresponding one of said first column lines and to said zero point, and having its gate coupled to said row potential selection circuit second additional output;

a column potential circuit;

a plurality of column inverters, each of said column inverters having its output coupled to one of said second plurality of column lines and having its switching section coupled between said zero point and said column potential circuit;

a plurality of memory data input terminals;

a plurality of first column transmission gates each having its switching section coupling one of said plurality of memory data input terminals to the input of one of said plurality of column inverters, a plurality of second column transmission gates each having s switching section coupling the input of one of said plurality of column inverters to said logic means output;

each of said first and second column transmission gates comprising a transistor of said first conductivity type and a transistor of said second conductivity type;

the gates of all of said first column transmission gate transistors of said first conductivity type and said second column transmission gate transistors of said second conductivity type coupled to said row potential selection circuit first additional output;

the gates of all of said first column transmission gate transistors of said second conductivity type and said second conductivity type and said second column transmission gate transistors of said first conductivity type being coupled to said row potential selection circuit second additional output.

8. A memory arrangement in accordance with claim 1, wherein:

said column potential selection circuit comprises:

first and second inverters for respectively receiving first and second ones of said selection signals;

a third inverter comprising first and second transistors of opposite conductivity types and having their switching sections serially connected between said programming voltage and an operating voltage, said first transistor being connected to said operating voltage and having its substrate connected to said zero point, said second transistor having its substrate formed as an insulating island coupled to said programming voltage, an output between said switching sections and said first inverter output coupled to the gates of said first and second transistors;

a fourth inverter comprising third and fourth transistors of opposite conductivity type and having their switching sections serially connected between said third inverter output and said zero point, then gates connected to said second inverter output, said potential selection circuit output being coupled to the junction of said serially connected switching sections, said third transistor having its substrate formed as an insulating island coupled to said third inverter output, said fourth transistor having its substrate coupled to said zero point.

9. A memory arrangement in accordance with claim 7, wherein said row potential selection circuit comprises input-sided first and second inverter receiving at the inputs first and second ones of said selection signals;

a third inverter having an input coupled to said first inverter output and having a switching section coupled between said operating voltage and said programming voltage, and having first and second transistors with the substrate of the transistor having its source connected to said operating voltage coupled to said zero point and the other transistor having its substrate formed as an insulating island, connected to the source terminal thereof and to said programming voltage, the output of said second inverter being connected to the input of a fourth inverter, said fourth inverter having third and fourth transistors, said fourth transistors having its source and substrate sides to the zero point of the circuit, said third transistor having its source and substrate connected to the output of said third inverter respectively, a fifth transistor serially connected between said third and fourth transistors and having its substrate connected to said zero point, with the substrate, said third transistor connected to the output of said third inverter and formed by a separate insulating island;

the point connecting the switching sections of said fifth transistor and said third potential output of said row potential selection circuit and is connected to said programming voltage via the switching section of an additional transistor;

a NOR gate operated by said programming voltage as the supply voltage forming a first input connected to the output of said first inverter and a second input connected to the input of said second inverter;

output of said NOR gate being said first additional potential output and a fifth inverter connected to the programming voltage as the supply voltage coupled to said NOR gate output to provide said second additional potential output; and the gates of said fifth transistor and said additional transistor are connected to said second additional potential output.

10. A memory arrangement in accordance with claim 2, wherein each of said plurality of memory cells is a TUSIS memory cell, each storage transistor having one large area gate and each select transistor has its gate coupled to a corresponding one of said plurality of second row lines;

and further comprising:

logic means having an output providing the exclusive OR of said selection signals;

a first plurality of column transistors of said first conductivity type, each having its switching section;

a first plurality of column transistors of said first conductivity type, each of said column transistors having its switching section coupled to a corresponding one of said first column lines and to said zero point, and having its gate coupled to said row potential selection circuit second additional output;

a column potential circuit;

a plurality of column inverters, each of said column inverters having its output coupled to one of said second plurality of column lines and having its switching section coupled between said zero point and said column potential circuit;

a plurality of memory data input terminals;

a plurality of first column transmission gates each having its switching section coupling one of said plurality of memory data input terminals to the input of one of said plurality of column inverters, a plurality of second column transmission gates each having a switching section coupling the input of one of said plurality of column inverters to said logic means output;

each of said first and second column transmission gates comprising a transistor of said first conductivity type and a transistor of said second conductivity type;

the gates of all of said first column transmission gate transistors of said first conductivity type and said second column transmission gate transistors of said second conductivity type coupled to said row potential selection circuit first additional output;

the gates of all of said first column transmission gate transistors of said second conductivity type and said second conductivity type and said second column transmission gate transistors of said first conductivity type being coupled to said row potential selection circuit second additional output.

* * * * *